United States Patent
Yao

(10) Patent No.: US 11,181,585 B2
(45) Date of Patent: Nov. 23, 2021

(54) ELECTRONIC DEVICE AND METHOD FOR DETECTING THE STATE OF HEALTH OF A BATTERY

(71) Applicant: Dongguan Amperex Technology Limited, Dongguan (CN)

(72) Inventor: Yuan Yao, Dongguan (CN)

(73) Assignee: DONGGUAN AMPEREX TECHNOLOGY LIMITED, Dongguan (CN)

(*) Notice: Subject to any disclaimer, the term of this patent is extended or adjusted under 35 U.S.C. 154(b) by 161 days.

(21) Appl. No.: 16/550,586

(22) Filed: Aug. 26, 2019

(65) Prior Publication Data

US 2020/0326379 A1 Oct. 15, 2020

(30) Foreign Application Priority Data

Apr. 11, 2019 (CN) .................. 201910289549.X

(51) Int. Cl.
*G01R 15/00* (2006.01)
*G01R 31/3842* (2019.01)
*G01R 31/392* (2019.01)

(52) U.S. Cl.
CPC ....... *G01R 31/3842* (2019.01); *G01R 31/392* (2019.01)

(58) Field of Classification Search
CPC .. G01R 31/367; G01R 31/374; G01R 31/379; G01R 31/382; G01R 31/3842; G01R 31/387; G01R 31/389; G01R 31/392; G01R 31/388; G01R 31/3606; G01R 31/3624; G01R 31/3634; G01R 31/3648; G01R 31/3651; G01R 31/3662; G01R 31/3665; G01R 31/3675; G01R 31/3679
USPC ......................................... 324/132
See application file for complete search history.

(56) References Cited

U.S. PATENT DOCUMENTS

| | | | | |
|---|---|---|---|---|
| 10,931,128 | B2* | 2/2021 | Basu | H01M 10/48 |
| 2006/0022676 | A1* | 2/2006 | Uesaka | G01R 31/3842 |
| | | | | 324/429 |
| 2012/0081075 | A1* | 4/2012 | Skelton | G01R 31/382 |
| | | | | 320/116 |
| 2019/0250215 | A1* | 8/2019 | Sung | G01R 31/382 |
| 2020/0033415 | A1* | 1/2020 | Furukawa | G01R 31/36 |

* cited by examiner

*Primary Examiner* — Thang X Le
(74) *Attorney, Agent, or Firm* — Westerman, Hattori, Daniels & Adrian, LLP

(57) ABSTRACT

A method for detecting state of health of a battery of an electronic device is provided. An initial capacity of the battery is obtained when the battery is charged or discharged with a predetermined current and in a predetermined temperature, and a first State of Charge (SOC) value is calculated when the battery is discharged to a discharge cutoff voltage. An available capacity of the battery is calculated with the predetermined current and in the predetermined temperature based on a maximum capacity of the battery, the first State of Charge value, and a second State of Charge value, and a capacity fade is obtain based on a ratio of the available capacity and the initial capacity. Thus, the state of health is detected based on the capacity fade.

24 Claims, 4 Drawing Sheets

ELECTRONIC DEVICE AND METHOD FOR DETECTING THE STATE OF HEALTH OF A BATTERY

CROSS-REFERENCE TO RELATED APPLICATIONS

This application claims priority to Chinese Patent Application No. 201910289549.X filed on Apr. 11, 2019, the contents of which are incorporated by reference herein.

FIELD

The subject matter herein generally relates to batteries.

BACKGROUND

An electronic device (e.g., electric motorcycle, electric car, and mobile phone) may have a battery. The battery will age and deteriorate in long-time use. For example, as battery ages, the internal resistance of the battery rises. Therefore, there is a need to provide a method for detecting the state of health of the battery.

SUMMARY

What is needed, is a battery health detecting method, an electronic device, and a non-transitory storage medium. The method can determine a state of health of a battery of the electronic device accurately.

The method for detecting the state of health of the battery includes: obtaining an initial capacity of the battery when the battery is charged or discharged with a predetermined current and in a predetermined temperature; calculating a first State of Charge (SOC) value when the battery is discharged to a discharge cutoff voltage; calculating an available capacity of the battery with the predetermined current and in the predetermined temperature based on a maximum capacity of the battery, the first State of Charge value, and a second State of Charge value; obtaining a capacity fade of the battery based on a ratio of the available capacity and the initial capacity, and determining the state of health based on the capacity fade.

The electronic device includes: a battery, a storage device, at least one processor, and the storage device further storing one or more programs that, when executed by the at least one processor, cause the at least one processor to: obtain an initial capacity of the battery when the battery is charged or discharged with a predetermined current and in a predetermined temperature; calculate a first State of Charge (SOC) value when the battery is discharged to a discharge cutoff voltage; calculate an available capacity of the battery with the predetermined current and in the predetermined temperature based on a maximum capacity of the battery, the first State of Charge value, and a second State of Charge value; obtain a capacity fade of the battery based on a ratio of the available capacity and the initial capacity, and determine the state of health based on the capacity fade.

A non-transitory storage medium having stored thereon instructions that, when executed by a processor of an electronic device, causes the processor to perform a battery health detecting method, the electronic device includes a battery, the method includes: obtaining an initial capacity of the battery when the battery is charged or discharged with a predetermined current and in a predetermined temperature; calculating a first State of Charge (SOC) value when the battery is discharged to a discharge cutoff voltage; calculating an available capacity of the battery with the predetermined current and in the predetermined temperature based on a maximum capacity of the battery, the first State of Charge value, and a second State of Charge value; obtaining a capacity fade of the battery based on a ratio of the available capacity and the initial capacity, and determining the state of health based on the capacity fade.

The battery health detecting method can determine the state of health of battery according a ratio of an available capacity and an initial capacity. The method can calculate the available capacity of the battery exactly without a full charge or a full discharge of the battery, and obtain the state of health based on the available capacity and the initial capacity. The battery health detecting method also can avoid the deviation in capacity calculations because of inconsistent temperature and current when the actual discharge temperature and current are calculated during tests. Without deviations in calculations of capacity, the determined state of health will always be accurate under the method.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
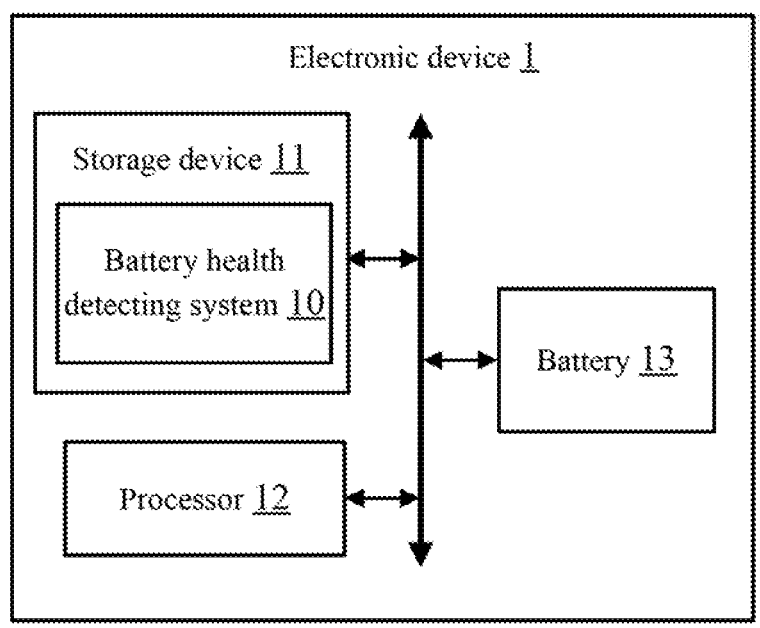
FIG. 1 is a block diagram of an embodiment of an electronic device including a battery health detecting system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The present disclosure, referencing the accompanying drawings, is illustrated by way of examples and not by way of limitation. It should be noted that references to "an" or "one" embodiment in this disclosure are not necessarily to the same embodiment, and such references mean "at least one."

Furthermore, the term "module", as used herein, refers to logic embodied in hardware or firmware, or to a collection of software instructions, written in a programming language, such as Java, C, or assembly. One or more software instructions in the modules can be embedded in firmware, such as in an EPROM. The modules described herein can be implemented as either software and/or hardware modules and can be stored in any type of non-transitory computer-readable medium or other storage device. Some non-limiting examples of non-transitory computer-readable media include CDs, DVDs, BLU-RAY, flash memory, and hard disk drives.

FIG. 1 illustrates an exemplary embodiment of an electronic device (electronic device 1). The electronic device 1 includes at least one battery 13 which can be rechargeable. In an exemplary embodiment, a battery health detecting system 10 is applied to the electronic device 1. In at least one exemplary embodiment, the electronic device 1 can further include, but is not limited to, a storage device 11, and at least one processor 12.

FIG. 1 illustrates only one example of the electronic device 1, other examples can comprise more or fewer components that those shown in the embodiment, or have a different configuration of the various components. The electronic device 1 can be, but is not limited to, an electric motorcycle, an electric bicycle, an electric car, a mobile phone, a tablet computer, a personal digital assistant (PDA), a personal computer, or any other suitable electronic device.

In at least one exemplary embodiment, the battery 13 supplies electrical energy to the electronic device 1. The battery 13 includes at least one battery cell, which can adopt a recyclable manner, and types of the battery 13 are not particularly limited. For example, the battery 13 can be, but is not limited to, a lead-acid battery, a nickel-cadmium battery, a nickel-hydrogen battery, a lithium-ion battery, a lithium polymer battery, and a lithium iron phosphate battery. The battery 13 is logically coupled to the processor 12 via a power management system. The power management system can enable functions such as charging, discharging, and power management for the electronic device 1.

In at least one exemplary embodiment, the electronic device 1 may further include other components such as a WI-FI unit, a BLUETOOTH unit, a speaker, and the like.

In at least one exemplary embodiment, the storage device 11 can be an internal storage device, such as a flash memory, a random access memory (RAM) for temporary storage, and/or a read-only memory (ROM) for permanent storage. The storage device 11 can also be an external storage device, such as an external hard disk, a storage card, or a data storage medium. The at least one processor 12 can be a central processing unit (CPU), a microprocessor, or other data processor chip that performs functions of the electronic device 1.

Figure 4:
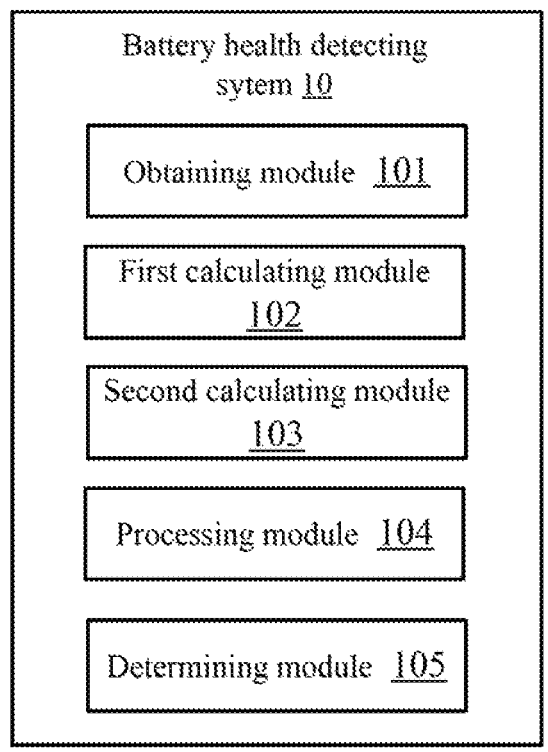
FIG. 4 is a block diagram of one embodiment of modules of a battery health detecting system in the electronic device of FIG. 1.

In at least one exemplary embodiment, the battery health detecting system 10 as shown in FIG. 4 can include, but is not limited to, an obtaining module 101, a first calculating module 102, a second calculating module 103, a processing module 104, and a determining module 105. The modules 101-105 can comprise computerized instructions in the form of one or more computer-readable programs that can be stored in a non-transitory computer-readable medium, for example in the storage device 11, and executed by the processor 12 of the electronic device 1. Functions of the modules 101-105 are described with reference to FIG. 2.

Figure 2:
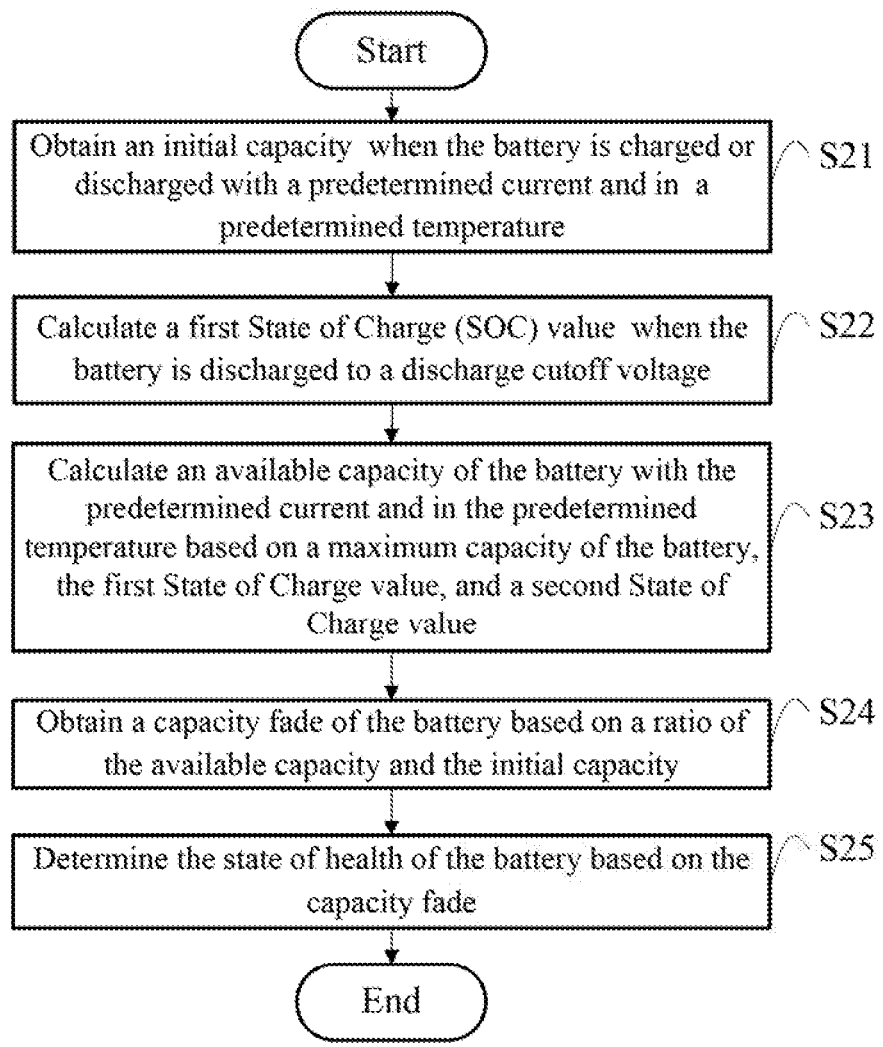
FIG. 2 is a flowchart of an embodiment of a method for detecting state of health of a battery.

FIG. 2 illustrates a flowchart of a method for correcting the sensed temperature of the battery. In an example embodiment, the method is performed by execution of computer-readable software program codes or instructions by the at least one processor 12 of the electronic device 1.

Referring to FIG. 2, the method is provided by way of example, as there are a variety of ways to carry out the method. The method described below can be carried out using the configurations illustrated in FIG. 1, for example, and various elements of these figures are referenced in explaining method. Each block shown in FIG. 2 represents one or more processes, methods, or subroutines, carried out in the method. Furthermore, the illustrated order of blocks is illustrative only and the order of the blocks can be changed. Additional blocks can be added or fewer blocks can be utilized without departing from this disclosure. The example method can begin at block S21.

At block S21, the obtaining module 101 can obtain an initial capacity $FCC_0$ when the battery 13 is charged or discharged with a predetermined current and in a predetermined temperature.

In at least one exemplary embodiment, the initial capacity of the battery 13 will be different when the battery 13 is charged or discharged with different currents and temperatures. In order to calibrate the capacity, detailed charging or discharging conditions are usually specified, and the capacity with the detailed conditions will be marked as the initial capacity in the predetermined temperature and with the predetermined current.

For example, the obtaining module 101 can obtain capacity when the battery 13 is charged with the predetermined current at 0.2 C and in the predetermined temperature being 25 degrees Celsius until the battery 13 is full, and discharged with the predetermined current at 0.2 C and the predetermined temperature being 25 degrees Celsius until the battery 13 empty. It should be noted that C is a rate of charge/rate of discharge, which is a value of current required when charged to a rated capacity or discharged the rated capacity within a predetermined time, which is numerically equal to a multiple of the rated capacity of the battery 13. For example, when the rated capacity of the battery 13 is 10 Ah and the battery 13 is discharged with 2 A, the rate of discharge is 0.2 C. When the battery 13 is discharged with 20 A, the rate of discharge is 2 C.

At block S22, the first calculating module 102 can calculate a first State of Charge (SOC) value defined as ASOC_end when the battery 13 is discharged to a discharge cutoff voltage.

In at least one exemplary embodiment, the first calculating module 102 can calculate a first voltage of the battery 13 as the battery 13 is discharged at intervals of a predetermined SOC value. The battery 13 begins to discharge with an initial SOC value. The calculating module 102 can compare the first voltage with the discharge cutoff voltage to determine whether a voltage of the battery 13 is approximated to the discharge cutoff voltage. The method of calculating ASOC_end value is described in FIG. 3 and below.

At block S23, the second calculating module 103 can calculate an available capacity of the battery 13 with the predetermined current and in the predetermined temperature based on a maximum capacity of the battery 13, the ASOC_end, and a second State of Charge value defined as ASOC_full.

In at least one exemplary embodiment, the available capacity is calculated based on formula: $FCC=Q_{max} \times (ASOC\_full-ASOC\_end)/100\%$, FCC is the available capacity, $Q_{max}$ is the maximum capacity, and ASOC_full is the second State of Charge value and ASOC_end is the first State of Charge value.

In at least one exemplary embodiment, ASOC_full is obtained by an open-circuit voltage table based on a voltage. The voltage is detected when the battery 13 is fully charged and in a resting state.

In at least one exemplary embodiment, the second calculating module 103 can calculate the maximum capacity when the battery 13 is rest for a first time period, and is charged for a second time period, and is still rest for a third time period, or the battery 13 is rest for a first time period, and is discharged for a second time period, and is still rest for a third time period.

For example, a battery 13 having a rated voltage range of 2.8V to 4.2V is taken as an example to describe the process of calculating the maximum capacity of the battery 13:

(1) The battery 13 is placed in an incubator for the first time period (e.g., two hours) to stabilize the temperature of cell of the battery 13, and the temperature of the incubator is 25 degrees Celsius.

(2) The battery 13 is charged for the second time period until the battery 13 is full after the charge cutoff voltage and the charge cutoff current have been set (the setting is applied later, see post). The charging process of the battery 13 can include four stages of charging, namely trickle-charging, constant-current-charging, constant-voltage-charging, and termination of charging. The charge cutoff voltage is a voltage when the battery 13 is charged during the constant-voltage-charging stage and the charge cutoff current is a current when the battery 13 is charged during the constant-current-charging stage.

(3) The battery 13 is rest for the third time period (e.g., two hours) to stabilize the temperature of cell of the battery 13.

(4) Setting the discharge cutoff voltage and the discharge cutoff current of the battery 13.

(5) Reading the capacity after discharging the fully charged battery 13 to the discharge cutoff voltage at a rate of 0.1 C or less, and the reading of the capacity is the maximum capacity of the battery 13.

In at least one exemplary embodiment, the $Q_{max}$ is the maximum capacity of the battery 13 during charging or discharging at very low rates.

In at least one exemplary embodiment, the maximum capacity is calculated based on formula: $Q_{max}=\Delta Q/(SOC_2-SOC_1)$, and $Q_{max}$ is the maximum capacity, $\Delta Q$ is capacity change after the battery 13 is charged or discharged for the second time period, $SOC_1$ is the State of Charge value after the battery 13 has rested for the first time period, and $SOC_2$ is the State of Charge value after the battery 13 has rested for the third time period.

In at least one exemplary embodiment, the second calculating module 103 divides the second time period based on predetermined intervals, and reads the current of the battery 13 after the battery 13 has been charged or discharged for each predetermined interval. The second calculating module 103 further obtains a discharge capacity after the battery 13 has been discharged for each predetermined interval, and the discharge capacity is equal to the current which is read minus the predetermined interval. The second calculating module 103 obtains the capacity change $\Delta Q$ by accumulating the discharge capacity.

At block S24, the processing module 104 can obtain a capacity fade of the battery 13 based on a ratio of the available capacity and the initial capacity, and Fading=FCC/$FCC_0$, Fading is the capacity fade.

In at least one exemplary embodiment, the capacity fade of the battery 13 refers to the rate of decay in the capacity of the battery 13.

At block S25, the determining module 105 can determine the state of health of the battery 13 based on the capacity fade.

In one exemplary embodiment, the state of health of the battery 13 is calculated based on formula: SOH=(Fading−EOL)/(100%−EOL), SOH is the state of health of the battery 13, Fading is the capacity fade of the battery 13, and EOL is a predetermined capacity fade. Using the battery 13 after the capacity of the battery 13 is decreased to the predetermined capacity fade is not recommended.

In another exemplary embodiment, the state of health of the battery 13 is equal to the capacity fade.

In at least one exemplary embodiment, the battery health detecting method can calculate the available capacity of the battery 13 exactly without a full charge or a full discharge of the battery, and obtain the state of health of the battery 13 based on the available capacity and the initial capacity. The battery health detecting method also can avoid the deviation in capacity calculations because of inconsistent temperature and current when the actual discharge temperature and current are calculated during tests. Without deviations in calculations of capacity, the determined state of health of the battery 13 will always be accurate under the method.

Figure 3:
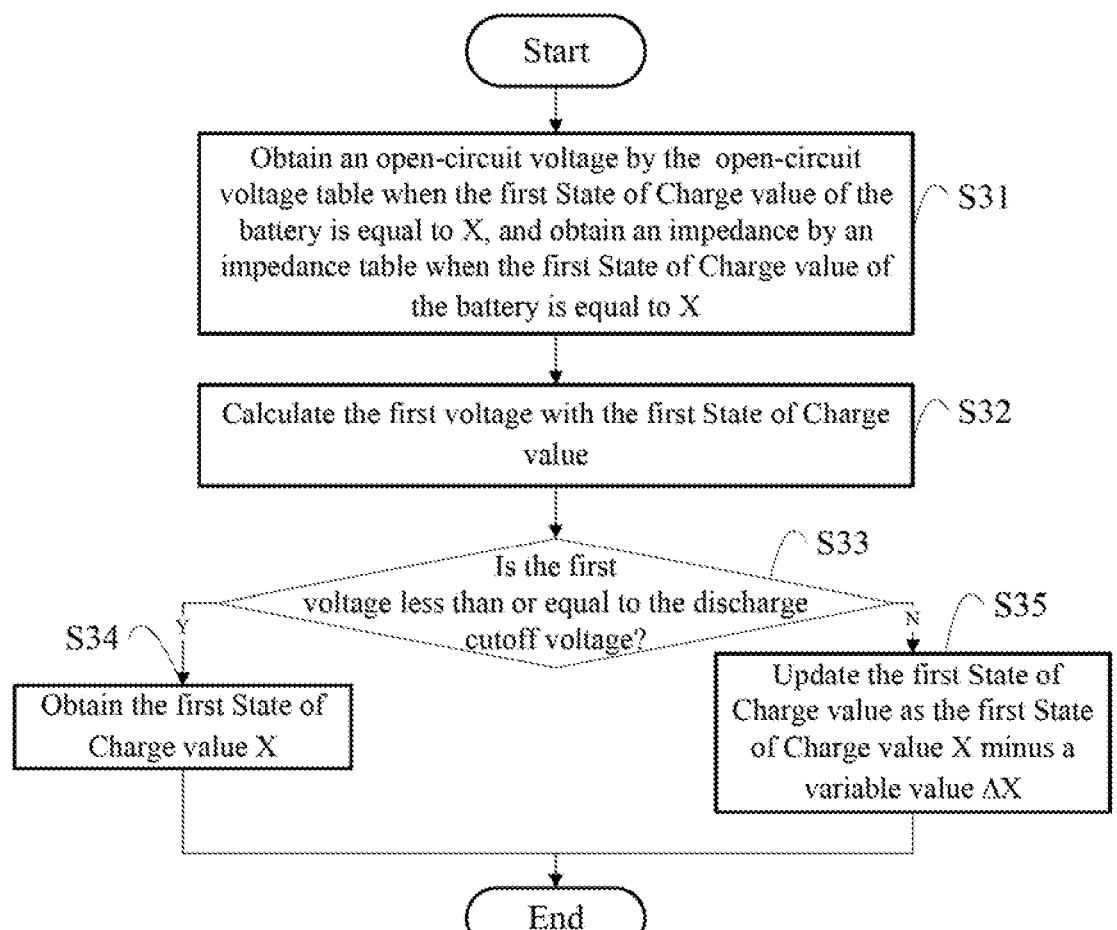
FIG. 3 is a flowchart of an embodiment of a method for calculating first State of Charge (SOC) value of a battery of the electronic device of FIG. 1.

FIG. 3 illustrates a flowchart of a method for calculating the first State of Charge (SOC) value of the battery. In an example embodiment, the method is performed by execution of computer-readable software program codes or instructions by the at least one processor 12 of the electronic device 1.

Referring to FIG. 3, the method is provided by way of example, as there are a variety of ways to carry out the method. The method described below can be carried out using the configurations illustrated in FIG. 1, for example, and various elements of these figures are referenced in explaining method. Each block shown in FIG. 3 represents one or more processes, methods, or subroutines, carried out in the method. Furthermore, the illustrated order of blocks is illustrative only and the order of the blocks can be changed. Additional blocks can be added or fewer blocks can be utilized without departing from this disclosure. The example method can begin at block S31.

At block S31, the obtaining module 101 can obtain an open-circuit voltage by the open-circuit voltage table when the first State of Charge value of the battery 13 is equal to X, and X∈[0,1], and obtain an impedance by an impedance table when the first State of Charge value of the battery 13 is equal to X. For example, the open-circuit voltage is OCV(X), and the impedance is R(X).

In at least one exemplary embodiment, the open-circuit voltage table is an OCV-SOC table, which describes corresponding relationship between the open-circuit voltage of the battery 13 and the State of Charge value of the battery 13. The obtaining module 101 can obtain the State of Charge value by adjusting the discharging capacity after getting the maximum capacity, and establish the corresponding relationship between the open-circuit voltage and the State of Charge value.

In at least one exemplary embodiment, the process to establish the corresponding relationship is as following:

(1) The battery 13 is placed in an incubator for the first time period (e.g., two hours) to stabilize the temperature of cell of the battery 13, and the temperature of the incubator is 25 degrees Celsius.

(2) The battery 13 is charged for the second time period until the battery 13 is full after the charge cutoff voltage and the charge cutoff current have been set.

(3) The battery 13 is rest for the third time period (e.g., two hours) to stabilize the temperature of cell of the battery 13.

(4) Setting the discharge cutoff voltage and the discharge cutoff current of the battery 13.

(5) Discharging the fully charged battery 13 for a fourth time period at a predetermined rate. For example, discharging the fully charged battery 13 for twelve minutes at the predetermined rate of 0.1 C, and 2% of the State of Charge of the battery 13 can be adjusted.

(6) Reading the open-circuit voltage after resting the battery 13 for a fifth time period (e.g., one hour). And the open-circuit voltage can be read after the State of Charge of the battery 13 adjusting 2%.

The steps (5) and (6) are cycled a predetermined number of times (e.g., 50 times), and a corresponding open-circuit voltage is recorded each time the charge value of 2% of the battery is adjusted, and then established the OCV-SOC table.

In at least one exemplary embodiment, the impedance table is a relationship between the impedance, the State of Charge value, and the temperature.

In at least one exemplary embodiment, as the difference of the impedance of the battery 13 in different temperatures and different State of Charge values are large. Therefore, it is usually necessary to establish the relationship between the impedance, the State of Charge value, and the temperature in advance to ensure higher precision impedance. It should be noted that, in a state where the temperature is low and the State of Charge value is low, the impedance cannot be measured due to the low voltage, and manual estimation is required.

In at least one exemplary embodiment, the process to record the impedance table is as following:

(1) The battery 13 is placed in an incubator for the first time period (e.g., two hours) to stabilize the temperature of cell of the battery 13, and the temperature of the incubator is 25 degrees Celsius.

(2) The battery 13 is charged for the second time period until the battery 13 is full after the charge cutoff voltage and the charge cutoff current have been set.

(3) The battery 13 is rest for the third time period (e.g., two hours) to stabilize the temperature of cell of the battery 13.

(4) Setting the discharge cutoff voltage and the discharge cutoff current of the battery 13.

(5) Discharging the fully charged battery 13 for a fourth time period with a predetermined rate of current, and the voltage of the battery 13 becomes to a predetermined voltage. For example, discharging the fully charged battery 13 until the voltage of the battery 13 becomes 2.5V with the predetermined rate of current is 0.1 C.

(6) Calculating the State of Charge value based on a discharge capacity, and the State of Charge value is equal to one hundred percent minus a ratio of the discharge capacity and the maximum capacity. The discharge capacity is equal to a product of the predetermined rate of current and the fourth time period.

(7) Obtaining the open-circuit voltage by the OCV-SOC table based on the calculated State of Charge value.

(8) Obtaining the impedance based on the open-circuit voltage and the predetermined voltage, and the impedance is equal to a ratio of a voltage difference and the predetermined rate of current, and the voltage difference is a product of the open-circuit voltage minus the predetermined voltage.

At block S32, the first calculating module 102 can calculate the first voltage with the first State of Charge (SOC) value. The first voltage is equal to a difference between the open-circuit voltage and a product of the predetermined current and the impedance. That is, the first voltage is calculated based on formula: $U(X)=OCV(X)-I \times R(X)$, and $OCV(X)$ is the open-circuit voltage, I is the predetermined current, and $R(X)$ is the impedance.

At block S33, the determining module 105 can determine whether the first voltage is less than or equal to the discharge cutoff voltage. When the first voltage is less than or equal to the discharge cutoff voltage, the process goes to block S34. When the first voltage is greater than the discharge cutoff voltage, the process goes to block S35.

At block S34, the obtaining module 101 can obtain the first State of Charge value X.

At block S35, the obtaining module 101 can update the first State of Charge value as the first State of Charge value X minus a variable value $\Delta X$, and the process returns to block S31. The $\Delta X$ is greater than zero and less than one. For example, the $\Delta X$ is 1%. Thus, the obtaining module 101 can obtain the first State of Charge value of the battery 13 after the battery 13 is discharged to the discharge cutoff voltage.

In at least one exemplary embodiment, the first State of Charge value calculating method can calculate the first voltage. The method further can determine whether the battery 13 is discharged to the discharge cutoff voltage by comparing the first voltage and the discharge cutoff voltage, and then can obtain the first State of Charge value corresponding to the discharge cutoff voltage.

It should be emphasized that the above-described embodiments of the present disclosure, including any particular embodiments, are merely possible examples of implementations, set forth for a clear understanding of the principles of the disclosure. Many variations and modifications can be made to the above-described embodiment(s) of the disclosure without departing substantially from the spirit and principles of the disclosure. All such modifications and variations are intended to be included herein within the scope of this disclosure and protected by the following claims.

What is claimed is:

1. An electronic device comprising:
   a battery;
   a storage device;
   at least one processor; and
   the storage device storing one or more programs that, when executed by the at least one processor, cause the at least one processor to:
   obtain an initial capacity of the battery when the battery is charged or discharged with a predetermined current and in a predetermined temperature;
   calculate a first State of Charge (SOC) value when the battery is discharged to a discharge cutoff voltage;
   obtain a Second State of Charge value by an open-circuit voltage table based on a detected voltage when the battery is fully charged;
   calculate an available capacity of the battery with the predetermined current and in the predetermined temperature based on a maximum capacity of the battery, the first State of Charge value, and the second State of Charge value;
   obtain a capacity fade of the battery based on a ratio of the available capacity and the initial capacity, and $Fading=FCC/FCC_0$, wherein Fading is the capacity fade, FCC is the available capacity, $FCC_0$ is the initial capacity; and
   determine the state of health of the battery based on the capacity fade.

2. The electronic device according to claim 1, wherein the at least one processor is further caused to:
- obtain an open-circuit voltage by an open-circuit voltage table when the first State of Charge value is equal to X, and the X is greater than zero and less than one;
- obtain an impedance by an impedance table when the first State of Charge value is equal to X;
- calculate a first voltage with the first State of Charge value, and the first voltage is equal to a difference between the open-circuit voltage and a product of the predetermined current and the impedance;
- determine whether the first voltage is less than or equal to the discharge cutoff voltage;
- obtain the first State of Charge value X when the first voltage is less than or equal to the discharge cutoff voltage; and
- update the first State of Charge value as the first State of Charge value X minus a variable value ΔX when the first voltage is greater than the discharge cutoff voltage, and continue to determine whether the first voltage is less than or equal to the discharge cutoff voltage when the first State of Charge value is equal to the first State of Charge value X minus the variable value ΔX, wherein ΔX is greater than zero and less than one.

3. The electronic device according to claim 1, wherein the maximum capacity of the battery is calculated when the battery is rest for a first time period, and is charged for a second time period, and is still rest for a third time period, or the maximum capacity of the battery is calculated when the battery is rest for a first time period, and is discharged for a second time period, and is still rest for a third time period.

4. The electronic device according to claim 3, wherein the maximum capacity of the battery is calculated based on formula: $Q_{max}=\Delta Q/(SOC_2-SOC_1)$, and $Q_{max}$ is the maximum capacity, $\Delta Q$ is capacity change when the battery is charged or discharged for the second time period, $SOC_1$ is the State of Charge value when the battery being rest for the first time period, and $SOC_2$ is the State of Charge value when the battery being rest for the third time period.

5. The electronic device according to claim 4, wherein the capacity change is calculated by:
- dividing the second time period based on a predetermined time period;
- detecting the current when the battery is discharged for each predetermined time period;
- obtaining a discharge capacity when the battery is charged or discharged for each predetermined time period, and the discharge capacity is equal to the detected current minus the predetermined time period; and
- obtaining the capacity change by accumulating the discharge capacity.

6. The electronic device according to claim 1, wherein the available capacity is calculated based on formula: $FCC=Q_{max}\times(ASOC\_full-ASOC\_end)/100\%$, and FCC is the available capacity, $Q_{max}$ is the maximum capacity, ASOC_full is the second State of Charge value and ASOC_end is the first State of Charge value.

7. The electronic device according to claim 6, wherein the second State of Charge value is obtained by an open-circuit voltage table based on a voltage, and the voltage is detected when the battery is fully charged and enters a resting state.

8. The electronic device according to claim 7, wherein the state of health of the battery is determined by:
- setting the state of health equal to the capacity fade;
- calculating the state of health based on formula: $SOH=(Fading-EOL)/(100\%-EOL)$, and SOH is the state of health, Fading is the capacity fade of the battery, and EOL is a predetermined capacity fade.

9. A battery health detecting method applied in an electronic device, the electronic device comprising a battery, the method comprising:
- obtaining an initial capacity of the battery when the battery is charged or discharged with a predetermined current and in a predetermined temperature;
- calculating a first State of Charge value when the battery is discharged to a discharge cutoff voltage;
- obtaining a Second State of Charge value by an open-circuit voltage table based on a detected voltage when the battery is fully charged;
- calculating an available capacity of the battery with the predetermined current and in the predetermined temperature based on a maximum capacity of the battery, the first State of Charge value, and the second State of Charge value;
- obtaining a capacity fade of the battery based on a ratio of the available capacity and the initial capacity, and $Fading=FCC/FCC_0$, wherein Fading is the capacity fade, FCC is the available capacity, $FCC_0$ is the initial capacity; and determining the state of health based on the capacity fade.

10. The method according to claim 9, wherein the method further comprising:
- obtaining an open-circuit voltage by an open-circuit voltage table when the first State of Charge value is equal to X, and the X is greater than zero and less than one;
- obtaining an impedance by an impedance table when the first State of Charge value is equal to X;
- calculating a first voltage with the first State of Charge value, and the first voltage is equal to a difference between the open-circuit voltage and a product of the predetermined current and the impedance;
- determining whether the first voltage is less than or equal to the discharge cutoff voltage;
- obtaining the first State of Charge value X when the first voltage is less than or equal to the discharge cutoff voltage; and
- updating the first State of Charge value as the first State of Charge value X minus a variable value when the first voltage is greater than the discharge cutoff voltage, and continue to determine whether the first voltage is less than or equal to the discharge cutoff voltage when the first State of Charge value is equal to the first State of Charge value X minus the variable value ΔX, wherein ΔX is greater than zero and less than one.

11. The method according to claim 9, wherein the maximum capacity of the battery is calculated when the battery is rest for a first time period, and is charged for a second time period, and is still rest for a third time period, or the maximum capacity of the battery is calculated when the battery is rest for a first time period, and is discharged for a second time period, and is still rest for a third time period.

12. The method according to claim 11, wherein the maximum capacity is of the battery calculated based on formula: $Q_{max}=\Delta Q/(SOC_2-SOC_1)$ and $Q_{max}$ is the maximum capacity, $\Delta Q$ is capacity change when the battery is charged or discharged for the second time period, $SOC_1$ is the State of Charge value when the battery being rest for the first time period, and $SOC_2$ is the State of Charge value when the battery being rest for the third time period.

13. The method according to claim 12, wherein the capacity change is calculated by:
- dividing the second time period based on a predetermined time period;

detecting the current when the battery is discharged for each predetermined time period;

obtaining a discharge capacity when the battery is charged or discharged for each predetermined time period, and the discharge capacity is equal to the detected current minus the predetermined time period; and obtaining the capacity change by accumulating the discharge capacity.

14. The method according to claim 9, wherein the available capacity is calculated based on formula: $FCC=Q_{max} \times (ASOC\_full-ASOC\_end)/100\%$, and FCC is the available capacity, $Q_{max}$ is the maximum capacity, ASOC_full is the second State of Charge value and ASOC_end is the first State of Charge value.

15. The method according to claim 14, wherein the second State of Charge value is obtained by an open-circuit voltage table based on a voltage, and the voltage is detected when the battery is fully charged and enters a resting state.

16. The method according to claim 15, wherein the state of health of the battery is determined by:

setting the state of health equal to the capacity fade; or calculating the state of health based on formula: $SOH=(Fading-EOL)/(100\%-EOL)$, and SOH is the state of health, Fading is the capacity fade of the battery, and EOL is a predetermined capacity fade.

17. A non-transitory storage medium having stored thereon instructions that, when executed by a processor of an electronic device, causes the processor to perform a battery health detecting method, the electronic device comprising a battery, the method comprising:

obtaining an initial capacity of the battery when the battery is charged or discharged with a predetermined current and in a predetermined temperature;

calculating a first State of Charge value when the battery is discharged to a discharge cutoff voltage;

obtaining a Second State of Charge value by an open-circuit voltage table based on a detected voltage when the battery is fully charged;

calculating an available capacity of the battery with the predetermined current and in the predetermined temperature based on a maximum capacity of the battery, the first State of Charge value, and the second State of Charge value;

obtaining a capacity fade of the battery based on a ratio of the available capacity and the initial capacity, and $Fading=FCC/FCC_0$, wherein Fading is the capacity fade, FCC is the available capacity, $FCC_0$ is the initial capacity; and determining the state of health based on the capacity fade.

18. The non-transitory storage medium according to claim 17, wherein the method further comprising:

obtaining an open-circuit voltage by an open-circuit voltage table when the first State of Charge value is equal to X, and the X is greater than zero and less than one;

obtaining an impedance by an impedance table when the first State of Charge value is equal to X;

calculating a first voltage with the first State of Charge value, and the first voltage is equal to a difference between the open-circuit voltage and a product of the predetermined current and the impedance;

determining whether the first voltage is less than or equal to the discharge cutoff voltage; obtaining the first State of Charge value X when the first voltage is less than or equal to the discharge cutoff voltage; and updating the first State of Charge value as the first State of Charge value X minus a variable value ΔX when the first voltage is greater than the discharge cutoff voltage, and continue to determine whether the first voltage is less than or equal to the discharge cutoff voltage when the first State of Charge value is equal to the first State of Charge value X minus a variable value ΔX, wherein ΔX is greater than zero and less than one.

19. The non-transitory storage medium according to claim 17, wherein the maximum capacity of the battery is calculated when the battery is rest for a first time period, and is charged for a second time period, and is still rest for a third time period, or the maximum capacity of the battery is calculated when the battery is rest for a first time period, and is discharged for a second time period, and is still rest for a third time period.

20. The non-transitory storage medium according to claim 19, wherein the maximum capacity of the battery is calculated based on formula: $Q_{max}=\Delta Q/(SOC_2-SOC_1)$ and $Q_{max}$ is the maximum capacity, ΔQ is capacity change when the battery is charged or discharged for the second time period, $SOC_1$ is the State of Charge value when the battery being rest for the first time period, and $SOC_2$ is the State of Charge value when the battery being rest for the third time period.

21. The non-transitory storage medium according to claim 20, wherein the capacity change is calculated by:

dividing the second time period based on a predetermined time period;

detecting the current when the battery is discharged for each predetermined time period;

obtaining a discharge capacity when the battery is charged or discharged for each predetermined time period, and the discharge capacity is equal to the detected current minus the predetermined time period; and obtaining the capacity change by accumulating the discharge capacity.

22. The non-transitory storage medium according to claim 17, wherein the available capacity is calculated based on formula: $FCC=Q_{max} \times (ASOC\_full-ASOC\_end)/100\%$, and FCC is the available capacity, $Q_{max}$ is the maximum capacity, ASOC_full is the second State of Charge value and ASOC_end is the first State of Charge value.

23. The non-transitory storage medium according to claim 22, wherein the second State of Charge value is obtained by an open-circuit voltage table based on a voltage, and the voltage is detected when the battery is fully charged and enters a resting state.

24. The non-transitory storage medium according to claim 23, wherein the state of health of the battery is determined by:

setting the state of health equal to the capacity fade; or calculating the state of health based on formula: $SOH=(Fading-EOL)/(100\%-EOL)$, and SOH is the state of health, Fading is the capacity fade of the battery, and EOL is a predetermined capacity fade.

* * * * *